(12) United States Patent
Hammerschmidt et al.

(10) Patent No.: US 10,289,508 B2
(45) Date of Patent: May 14, 2019

(54) SENSOR SYSTEM AND METHOD FOR IDENTIFYING FAULTS RELATED TO A SUBSTRATE

(71) Applicant: Infineon Technologies AG, Neubiberg (DE)

(72) Inventors: Dirk Hammerschmidt, Villach (AT); Friedrich Rasbornig, Klagenfurt (AT); Wolfgang Scheibenzuber, Munich (DE); Wolfgang Scherr, Villach Landskron (AT); Thomas Zettler, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 333 days.

(21) Appl. No.: 15/002,587

(22) Filed: Jan. 21, 2016

(65) Prior Publication Data

US 2016/0223610 A1 Aug. 4, 2016

Related U.S. Application Data

(60) Provisional application No. 62/111,557, filed on Feb. 3, 2015.

(51) Int. Cl.
*G06F 11/22* (2006.01)
*G01R 31/28* (2006.01)
*G01R 31/00* (2006.01)

(52) U.S. Cl.
CPC .......... *G06F 11/22* (2013.01); *G01R 31/2829* (2013.01); *G01R 31/007* (2013.01);
(Continued)

(58) Field of Classification Search
CPC . H01L 2924/15311; H01L 2224/49109; H01L 2224/48247; H01L 2224/48227;
(Continued)

(56) References Cited

U.S. PATENT DOCUMENTS 5,583,297 A * 12/1996 Stocker .................. G01L 21/12
73/700
5,589,766 A * 12/1996 Frank .................. G01R 31/2884
324/73.1

(Continued)

FOREIGN PATENT DOCUMENTS

CN 1228836 9/1999
CN 1604326 4/2005
(Continued)

OTHER PUBLICATIONS

K. Seeger, Semiconductor Physics: An Introduction, 9th Edition, Springer Verlag, 2004, 8 pages.
(Continued)

*Primary Examiner* — Tung X Nguyen
*Assistant Examiner* — Dominic Hawkins
(74) *Attorney, Agent, or Firm* — Harrity & Harrity, LLP

(57) ABSTRACT

The present disclosure teaches a sensor system comprising at least two sensor elements causing increased reliability of individual sensor signals due to increased diagnostic coverage using diverse signal paths, diverse signal representations of sensor signals, merging of individual sensor signals maintaining independence of individual sensor signals comprised in protocol representations thereof.

20 Claims, 10 Drawing Sheets

(52) U.S. Cl.
CPC ............... *H01L 2224/16225* (2013.01); *H01L 2224/16245* (2013.01); *H01L 2224/48091* (2013.01); *H01L 2224/48227* (2013.01); *H01L 2224/48247* (2013.01); *H01L 2224/49109* (2013.01); *H01L 2924/15311* (2013.01); *H01L 2924/181* (2013.01)

(58) Field of Classification Search
CPC . H01L 2224/16225; H01L 2224/16245; H01L 2224/48091
See application file for complete search history.

(56) References Cited

U.S. PATENT DOCUMENTS

| | | | |
|---|---|---|---|
| 5,713,668 A | | 2/1998 | Lunghofer et al. |
| 6,525,544 B1 | * | 2/2003 | Okada ............... G01R 31/2648 |
| | | | 257/E21.531 |
| 6,651,212 B1 | | 11/2003 | Katayama et al. |
| 6,908,227 B2 | | 6/2005 | Rusu et al. |
| 6,960,974 B2 | | 11/2005 | Wan et al. |
| 7,255,010 B2 | | 8/2007 | Ausserlechner |
| 9,046,556 B2 | | 6/2015 | Fugate et al. |
| 9,112,529 B1 | | 8/2015 | Mazahreh |
| 2002/0039893 A1 | * | 4/2002 | Ylamurto ............... H03D 3/008 |
| | | | 455/189.1 |
| 2005/0257605 A1 | * | 11/2005 | Colvin ............... G01F 1/36 |
| | | | 73/114.76 |
| 2006/0123322 A1 | | 6/2006 | Leung et al. |
| 2007/0165709 A1 | | 7/2007 | Walker |
| 2007/0261492 A1 | * | 11/2007 | Board ............... G01M 13/028 |
| | | | 73/587 |
| 2007/0262831 A1 | * | 11/2007 | Van Beek ............... H03H 9/02448 |
| | | | 333/186 |
| 2008/0080119 A1 | * | 4/2008 | Ho ............... H02H 5/044 |
| | | | 361/274.1 |
| 2009/0268662 A1 | | 10/2009 | Larsson |
| 2010/0301332 A1 | * | 12/2010 | Dibra ............... G01K 1/026 |
| | | | 257/48 |
| 2011/0194221 A1 | * | 8/2011 | Ohta ............... G01R 33/0023 |
| | | | 361/63 |
| 2013/0200909 A1 | * | 8/2013 | Rasbornig ............... G01R 31/3187 |
| | | | 324/750.3 |
| 2014/0245098 A1 | | 8/2014 | Sharon |
| 2014/0269505 A1 | | 9/2014 | Medard |
| 2015/0256289 A1 | | 9/2015 | Emami |
| 2015/0318869 A1 | | 11/2015 | Hung |
| 2015/0363263 A1 | | 12/2015 | Hassner |
| 2016/0223610 A1 | * | 8/2016 | Hammerschmidt ............... |
| | | | G01R 31/2829 |
| 2017/0138185 A1 | | 5/2017 | Saed |

FOREIGN PATENT DOCUMENTS

| | | |
|---|---|---|
| CN | 1692326 | 11/2005 |
| CN | 1841973 A | 4/2006 |
| CN | 1891002 A | 3/2007 |
| CN | 101312387 A | 11/2008 |
| CN | 103512586 | 1/2014 |
| CN | 104048692 | 9/2014 |
| DE | 102015215412.2 | 8/2015 |
| KR | 100391240 | 7/2003 |
| WO | WO 2004/045075 | 5/2004 |
| WO | WO 2009/047812 | 4/2009 |

OTHER PUBLICATIONS

Weste et al., "CMOS VLSI Design. A circuits and systems perspective," Addison Wesley Longman, 2010, 3 pages.
Co-pending U.S. Appl. No. 14/462,844 filed Aug. 19, 2014 entitled "Protected Transmission of Independent Sensor Signals," Hammerschmidt, 33 pages.

* cited by examiner

SENSOR SYSTEM AND METHOD FOR IDENTIFYING FAULTS RELATED TO A SUBSTRATE

RELATED APPLICATION

This application is a non-provisional application claiming priority to U.S. Provisional Application No. 62/111,557, filed Feb. 3, 2015, which is incorporated herein in its entirety.

BACKGROUND

The functional safety of electronic systems in complex systems, such as but not limited to automotive vehicles, is an important topic in the light of increasing automation and semiconductor content of modern automotive vehicles. It is desirable to have reliable and safe integrated circuits as components for safety related systems. The safety capability of the component may be described by a defined reaction on an unintended fault leading to a safe state.

SUMMARY

Therefore there is a need to devise methods and devices providing the required safety features for complex systems, such as automotive vehicles.

For integrated circuits on a semiconductor substrate several fault conditions are related to the substrate. Faults in systems caused by issues related to the substrate may be considered as faults having a common cause. Such failures may remain undetected as several portions of the system on the substrate may react substantially identical to the common cause induced by the substrate, such as a crack, temperature changes, humidity, mechanical stress, charge carrier density and/or charge carrier mobility within the substrate.

The present disclosure describes inter alia safety features, protocols and/or methods enabling a diagnosis of a complex system in order to assess whether or not the system or parts of the system may still be trusted. In other words there is a need to provide complex systems with an increased diagnostic coverage.

It is an aim of the present disclosure to devise complex systems with increased diagnostic coverage.

BRIEF DESCRIPTION OF THE DRAWINGS

The present disclosure shall be explained in the following with reference to the following drawings

DETAILED DESCRIPTION

The figures together with the following description shall not be construed in a limiting way but merely as non-limiting examples of how the teachings of the present disclosure may be put into practice by a person skilled in the art.

For integrated circuits on a semiconductor substrate several fault conditions may be related to the substrate. Faults in systems caused by issues related to the substrate may be considered as faults having a common cause. Such failures may remain undetected as several portions of the system on the substrate may react substantially identical to the common cause induced by the substrate, such as a crack, temperature changes, humidity, mechanical stress, charge carrier density and/or charge carrier mobility within the substrate. Therefore in order to increase reliability of complex systems it is of interest to increase diagnostic coverage for such systems when it comes to common cause faults.

Figure 1:
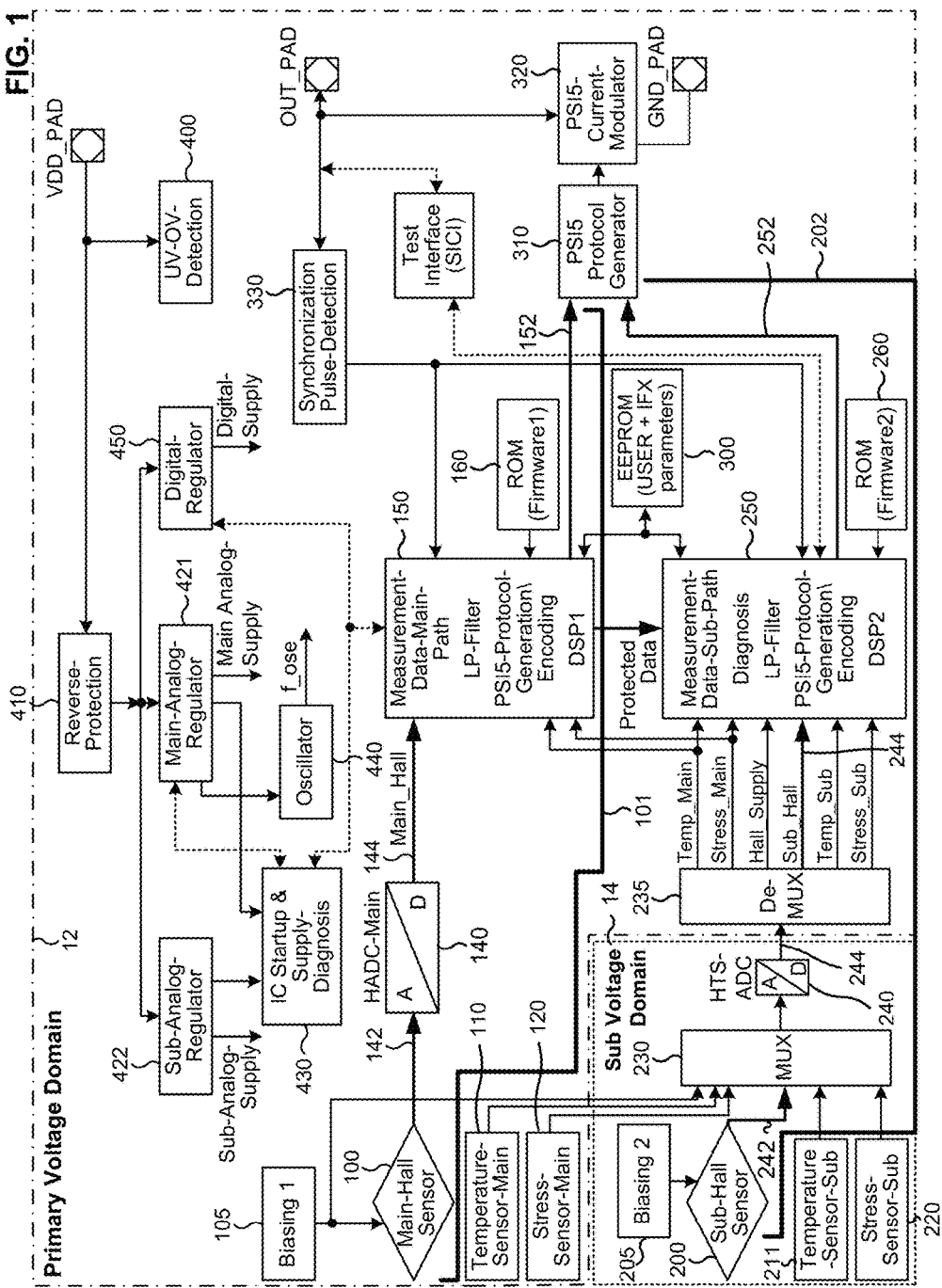
FIG. 1 shows a sensor system 10 with increase diagnostic coverage.

FIG. 1 shows a sensor system 10 with increased diagnostic coverage. The sensor system 10 shall be explained in the following using the example of a magnetic sensor system as may be useable for an angle measurement but is not limited thereto.

The sensor system 10 according to the present disclosure may be divided into main portion 12 and sub portion 14. It may be of interest for the sub-portion 14 to be smaller, less performant, and/or less accurate than the main portion 12 as may be explained in the following.

The main portion 12 may comprise a main sensor element 100 configured to measure a physical quantity, for example an angle of an external rotating magnetic field. The main sensor element 100 may be implemented as group of (coupled) sensor elements. As a non-limiting example the main sensor element 100 may comprise eight (coupled) Hall plates or Hall sensors, but is not limited thereto.

The sub portion 14 may comprise a sub sensor element 200 configured to measure the physical quantity, for example the angle of the rotating magnetic field. The sub sensor element 200 may be implemented as a group of (coupled) sensor elements, say a group of one or more (coupled) Hall sensors or Hall plates. It may be of interest to provide the main sensor element 100 with more Hall plates than the sub sensor element. This will be of advantage in order to provide a signal to noise ratio (SNR) for the main sensor element 100 that is different from an SNR of the sub sensor element 200. Therefore a main signal path 101 will provide a signal with a SNR different from the SNR of the sub path 102.

Further it may be of interest to provide the main sensor element 100 with a different operating voltage or biasing 105 than the sub or second sensor element 200 depending on circumstances. In the example of FIG. 1 the main sensor element 100 is provided with a biasing 105 higher than a biasing 205 provided for the second sensor element 200, it could be however the other way round without departing from the present disclosure.

Providing different biasing 105, 205 for the first sensor element 100 and the sub sensor element 200 may be of particular interest, if first and sub sensor element 200 have sensitivities depending on the operating voltage or biasing. For such sensor elements 100, 200 the first sensor element 100 may have a higher sensitivity than the sub sensor element 200, if the first biasing 105 is higher or larger in magnitude than the second biasing 205. In consequence, while first and sub sensor element 100, 200, will measure the physical quantity with different sensitivity and hence different accuracy.

It may further be of interest for the first sensor element 100 and the sub sensor element 200 to be diverse in measurement principle this could be achieved by providing the first sensor element as a GMR sensor element while the sub sensor element 200 is implemented as a group of (coupled) Hall elements.

As a further example the first sensor element 100 and the sub sensor element 200 may be implemented diverse in their respective response to an external parameter. In particular the external parameter may have an impact on properties of the substrate which may lead to undetected faults due a common cause, namely the external parameter. Without limitation the external parameter may be charge carrier density, charge carrier mobility, temperature, mechanical stress, humidity and the like.

Providing the first sensor element 100 and the sub sensor element 200 diverse in response to the external parameter will cause the first sensor element 100 and the sub sensor element 200 to respond differently to the external parameter. This difference in response may be used as an indication that that the external parameter is affecting the behavior of the system significantly.

Without limitation first and sub sensor element 100, 200 may be implemented diversely even as Hall sensor elements mentioned above. As a non-limiting example the first sensor element 100 and the sub sensor element 200 may have different temperature dependencies. As a mere example the first sensor element 100 may implemented with substantially no or very little temperature dependence, while the sub sensor element 200 is in turn implemented with pronounced temperature dependence, say a positive temperature dependence. Such a selection will cause measured value of the physical quantity (i.e. magnetic field angle) from the first sensor element 100 to be detectably different from the measured value of the physical quantity measured by the sub sensor element 200. This way a difference in temperature condition at the first sensor element 100 and the sub sensor element 200 is detectable. Depending on circumstances a different value measured by diverse first sensor element 100 and sub sensor element 200 may be indicative of the external parameter (for example temperature) having an impact leading to common cause errors. The common cause errors are now detectable using the diverse first and sub sensor element 100, 200.

It may be convenient to provide the main sensor element 100 and/or the main portion 12 as operable on a main voltage higher than the sub voltage on which the sub portion 14 and/or the sub sensor element 200 are operable, or vice versa. Different voltage levels may be of interest for the first sensor element 100 and the sub sensor element 200 having a sensitivity depending on the biasing voltage.

In the example of FIG. 1 the first portion 12 of the sensor system 10 being supplied by the main voltage is indicated by the dashed-dotted line enclosing the first portion 12, while the sub portion 14 being supplied by the sub voltage is indicated by the dotted line enclosing the second portion 14. A person of ordinary skill will readily appreciate that this constitutes a mere design choice but is in no way to be construed as limiting the teaching of the present disclosure.

The first sensor element 100 will forward first values of the physical quantity along a first signal path 101. The first signal path 101 may comprise a first analog to digital converter 140, referred to HADC 140 in the following. The first HADC 140 provides a first digital representation 142 of the first measured values. The first digital representation may be forwarded to a first digital signal processor 150, in the following referred to as first DSP 150. The first DSP 150 may provide a first processed signal 152 to a protocol generator 310. It may be of interest to provide a first firmware within a first memory 160, as shall be explained further down. In the example of FIG. 1 the sensor system 10 is implemented to operate according to a current protocol, such as PSI5 but not limited thereto.

The sub sensor element 200 will forward sub values or second values of the physical quantity along a second signal path 201. The second signal path 201 may comprise a second analog to digital converter 240, referred to sub ADC 240 in the following. The first sub ADC 240 provides a second digital representation 142 of the measured sub values. It may be of interest to provide a second firmware for the sub DSP 250. The second digital representation 142 may be forwarded to a second digital signal processor 250, in the following referred to as second or sub DSP 250. The sub DSP 250 may provide a processed sub signal 252 to a protocol generator 310. In the example of FIG. 1 the sensor system 10 is implemented to operate according to a current protocol, such as PSI5 but not limited thereto. A person of ordinary skill will however readily appreciate that concepts according to the present disclosure may without limitation be implemented for other protocols alike.

In order to increase diagnostic coverage of the sensor system 10 it may be of interest to implement the first DSP 150 and the sub DSP 250 distinct. As a further option, first DSP and sub DSP 150, 250, may be implemented diverse. As a first level of diversity, the first DSP and the sub DSP may be implemented using distinct firmware, i.e. a first firmware for the first DSP 150, optionally stored in the first memory 160 and a second software, for example a second firmware for the sub DSP 160 to be stored in the second memory 260. The first memory and/or the second memory may be protected using known error correction notes in order to assure, that correct values are stored within each of the first and second memory 160, 260.

As yet a further option the first DSP 150 may use calculation algorithms distinct or even divers from calculation algorithms used by the sub DSP 250.

Within the sub signal path 202 there is a multiplexer 230. The multiplexer 230 is configured to receive the sub sensor signal and a temperature signal from a sub temperature sensor 210, and a sub stress sensor 220. The sub temperature sensor 210 may conveniently be arranged in proximity of the sub stress sensor 220.

The multiplexer 230 may further be configured to receive a first stress signal from a first stress sensor 120, and/or a first temperature signal from a first temperature sensor 110. It may be convenient to arrange the first temperature sensor 110 and the first stress sensor 120 approximate to the first sensor element 100.

It is to be noted that the first temperature sensor 110, the first stress sensor 120, the second temperature sensor 210 and the sub stress sensor 220 may be deployed in order to monitor external parameters, such as temperature and/or mechanical stress at the position of the first sensor element 100 and the second sensor element 200, respectively.

It may further be of interest to implement the first temperature sensor 110 diverse from the second temperature sensor 210. Likewise the first stress sensor 120 may be implemented diverse to the second or sub stress sensor 220.

A person of ordinary skill will appreciate, that the first and second temperature sensors 110, 210 and the first and second stress sensors 120 and 220 are illustrative examples of auxiliary sensors measuring an external parameter, potentially having an effect on reliability of the sensor system 10 as a whole, namely an error due to a common cause. A person skilled in the art will conceive other auxiliary sensors pertaining to parameters potentially having an impact on the sensor system 10, as a whole without departing from the teachings of the present disclosure.

Again the diverse auxiliary sensors 110, 210 and 120 and 220 may have a different response characteristic to the external parameter measured, respectively. Such diverse responses of auxiliary sensors are illustrated in FIG. 3

Figure 3:
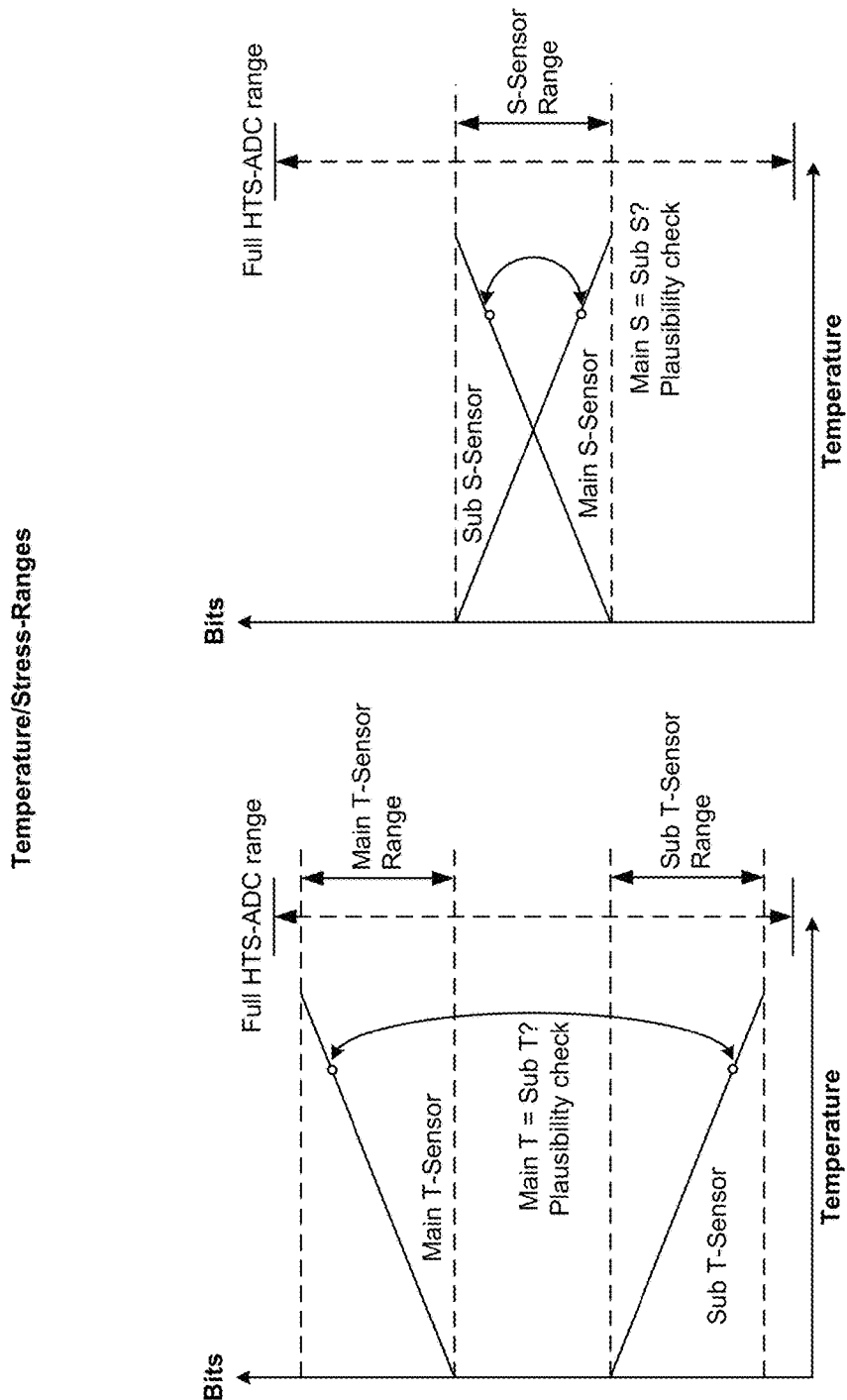
FIG. 3 shows examples of response functions for pairs of diverse sensors.

In the left section of FIG. 3 there is a response characteristic of the first temperature sensor 110 illustrated in the upper left portion, showing a positive temperature coefficient. Conversely the temperature dependence of the second temperature sensor or sub temperature sensor 210 is shown in the left lower portion of FIG. 3.

In many practical applications of sensor system 10 external parameters such as temperature, mechanical stress, and/or humidity may be reasonably expected to be substantially identical for the first auxiliary sensors 110, 120 and the second auxiliary sensors 210, 220. Should the first and second temperature sensors 110, 210 provide different temperature values, each. The difference in temperature will become more pronounced with increasing difference due to the diverse design of the first temperature sensor 110 and the sub temperature sensor 210.

It is to be understood that the diversity of the first and sub temperature sensor 110, 210 may be used to further increase diagnostic coverage of the sensor system 10. This is in particular true if it is possible for the sub ADC 240 to represent the first temperatures measured by the first temperature sensor 110 in a main or first value range and the second temperatures measured by the second temperature sensor 210 in a sub value range. It may be of further advantage to have the first value range to be different and non-overlapping with the sub value range.

If the digital representation of the first temperature signal lies within the first value range, while the digital representation of the sub temperature signal does not lie within the second or sub value range, this may be an indication that one of the temperature sensors 110, 210 is no longer working reliably and a warning may be issued within the protocol signal issued by the protocol generator 310. Should however the first processed sensor signal 152 and the second sensor signal 252 be substantially identical, this may be an indication that the sub ADC 240 may be having a problem and a corresponding warning may be issued.

With regards to divers first stress sensor 120 and sub stress sensor 220 an example of response behavior to mechanical stress is shown in the right portion of FIG. 3. The first stress sensor 120 shows a positive stress behavior while the sub stress sensor 220 shows a negative stress behavior. For diverse auxiliary sensors it may however be difficult to provide a digital representation of the first auxiliary sensor signal in a first value range different and non-overlapping to a second value range for digital representations of the second auxiliary sensor. Such a situation is depicted in the right portion of FIG. 3 wherein the digital representations of signal from first stress sensor 120 does not fall in a first value range distinct and non-overlapping to a second stress value range for digital representations of the second stress sensor 220 signal. Even for overlapping ranges for digital stress sensor signal representations the respective values should be somewhat symmetrical around a crossing value.

So if now the first and second temperature sensor signals lead to inconsistent digital temperature value representations while the digital representation of first and sub stress sensors 120, 220 is within the expected ranges, this is an indication that one of the temperature sensors 110, 210 is not working reliably and a corresponding warning may be issued.

Should however the digital representation of the first stress signal and the sub stress signal not be within the expected behavior of FIG. 3, this could be an indication that there is a substantial stress gradient within the sensor system 10, due to some packaging issues, such as partial delamination of the package associated with the sensor system 10 and a corresponding warning may be issued.

Should instead the digital representation of the first stress signal and the sub stress signal not be within the expected behavior of FIG. 3, while the digital representations of the first temperature signal and the second temperature signal are within the expected value ranges, this could be an indication that one of the temperature sensors 110, 210 has a problem, while the sub ADC 240 is working reliably.

Conversely, with an unreliable sub ADC 240 one would expect inconsistent values for both digital temperature signal representations and digital stress sensor signal representations.

The second signal path 202 as illustrated in FIG. 1 may further comprise a demultiplexer 235 operable with the sub DSP 250 and the multiplexer 230. It is to be understood that the demultiplexer 235 is configured to provide digital representations of the sub sensor signal 242, the first temperature sensor signal Temp_Main, the main or first stress signal Stress_Main, the biasing of the sub sensor Hall_Supply, the sub temperature sensor signal Temp_Sub, and the sub stress sensor signal Stress_Sub to the sub DSP 250, respectively. Therefore the relations between the diverse auxiliary sensor signals may be checked and/or assessed as was explained with regards to FIG. 3.

The temperature coefficients and/or offsets for the first temperature sensor 110, the first stress sensor 120, the sub biasing 205, the sub temperature sensor signal Temp_Sub, and the sub stress sensor 220 may be conveniently stored in an EPROM 300, respectively in order to facilitate the assessment of auxiliary sensor signals as discussed above within the sub DSP 250. The sub DSP 250 may further comprise a low-pass filter functionality as known in the art. The same holds for the first DSP 250.

While digital representations of auxiliary sensor signals may be provided to both, the first and the sub DSP 150, 250, it is to be noted that a digital representation of the first sensor signal 142 is provided to the first DSP 150 but not to the sub DSP 250. This is of interest to keep the processing of the first sensor signal independent and diverse from the sub sensor signal processing, even at DSP level. Hence any problem related to the first signal path 101 shall not have an effect on the second signal path 202.

The first DSP 150 may provide a protocol processing according to a selected protocol, for example the PSI5 protocol. Further the first DSP 150 may provide an error protection according to a known error protection scheme, such as CRC codes. Alternatively and without any limitation other suitable linear block codes may be used for encoding and/or error protection, such as Manchester encoding.

The first DSP 150 may calculate an error protection code for the first sensor signal 142, more precisely for the digital representation 144 of the first sensor signal 142. It may be convenient to use any linear block code for the error protection, such as Manchester encoding, Hadamard-Code, Reed-Solomon-Code or Golay-Codes to mention just some suitable examples.

As known in the art, the digital representation 144 of the first sensor signal 142 may be forwarded as first frame 152 to the protocol generator 310.

The second DSP 250 may calculate an error protection code for the second sensor signal 242, more precisely for the second digital representation 244 of the second sensor signal 242. It may be convenient to use any linear block code for the error protection of the second digital representation. As known in the art, the second digital representation 244 of the second sensor signal 242 may be forwarded as second frame 152 to the protocol generator 310.

According to the present disclosure the first frame and the second frame may be merged into a merged frame using a suitable operation. A suitable operation is an operation that maintains the separability of the first frame and the second frame. Separability of first and second frame may be understood as an operation that maintains the diversity of the first sensor signal 142 and the sub sensor signal 242 even at protocol level for the merged frame.

The suitable operation may be explained in the following. For a CRC error protection one may provide the first frame of a sufficient width, wherein a first number of bits represents a protocol representation of the processed first sensor signal together with error correction information regarding the error protection for this protocol representation. The remaining bits within the frame may however be kept at zero level or zero padded.

Using the CRC error protection one may provide the second frame of the same, sufficient width, wherein the remaining number of bits represents a protocol representation of the processed second sensor signal including error correction information for this protocol representation. The first number of bits are filled with zeros as a place holder or zero padding making room for the protocol representation of the processed first sensor signal.

The suitable operation for merging may replace the padded zero positions with the protocol representation of the processed second sensor signal. However the suitable operation for merging may not alter the protocol representation of the processed first sensor signal. Using CRC codes such a suitable operation would be an X-OR operation of first frame and the second frame of the sufficient length as described above.

A person of ordinary skill will understand that other suitable functions may exist for linear block codes. Therefore the example of the X-OR function as the suitable function shall not be construed as limiting the teaching of the present disclosure.

The merging of frames may be conveniently provided by the protocol generator 310.

Alternatively the first DSP 150 may provide the protected first frame to the sub DSP 250 as indicated in FIG. 1, such that the merging as described above is performed by sub DSP 250.

It may be convenient first DSP to calculate a seed value for the error protection of the first frame, while the second DSP calculates a second seed value for the error protection of the second frame.

Alternatively the first DSP may calculate the seed value for CRC calculation for the second DSP based on a processed first frame. For such a calculation of error protection the sub DSP 250 may calculate a common CRC based on the seed value derived from the first processed frame and the second processed frame.

With a merged frame as described the separability of the (protocol) representation of the first frame and the (protocol) representation of the second frame is maintained even when the merged frame is being transmitted over an unreliable channel. Regardless of what entity affects the merged frame along the channel separability of the (padded) first signal frame and the second (padded) signal frame is maintained.

The sensor system 10 may further comprise an under voltage and/or overvoltage detection element 400 as is known in the art. Likewise the sensor system 10 may comprise a reverse protection as known in the art. Furthermore coupled to the reverse protection 410, there may be a sub analogue regulator 422 providing analogue supply voltages to the analogue elements within the sub path 202. Further the sensor system 10 may comprise a main analogue regulator 421 configured to provide an analogue voltage supply to analogue portions of the main signal path 101 and or oscillator 440.

The sub analogue regulator 422, the main analogue regulator 421 and the digital regulator 450 may feed supply signals, i.e. voltages into a start-up and supply diagnosis element 430. The start-up and supply diagnosis element 430 may be of interest in order to assure that all supply systems of the sensor system 10 are started correctly and/or operating correctly.

The sensor system 10 may further comprise a synchronization pulse detection element 330 configured to detect a synchronization pulse related to the selected current protocol, for example the PSI5 protocol.

It may be convenient to further provide the digital representation of the first temperature signal Temp_Main, and/or the digital representation of the first stress signal Stress_Main to the first DSP 150.

Figure 2:
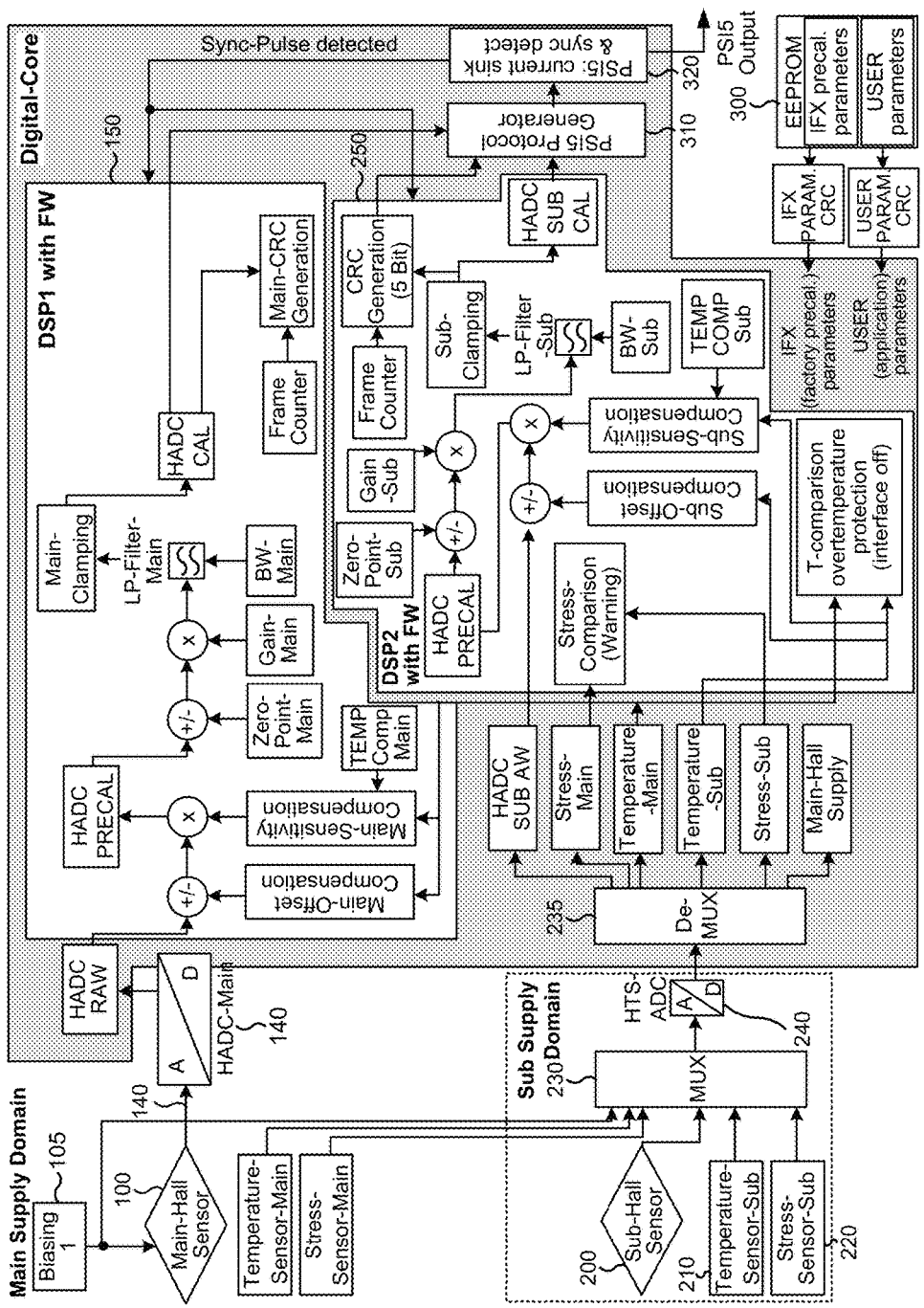
FIG. 2 shows details on interactions of various components of the sensor system 10.

FIG. 2 gives an overview of possible implementations of the functionality within the first DSP 150 and the second DSP 250, both of which may be provided within a digital core of the sensor system 10. For ease of understanding like entities are indicated with identical reference numerals.

The digital representation of the first signal 144 enters the first DSP 150 as an HADC Raw data. The first temperature signal T_Main of the first temperature sensor 110 together with the temperature signal Temp_Sub of the sub temperature sensor 210 may be used to perform a temperature comparison and an over temperature protection. Should the measured temperatures exceed an upper limit, the interface of the sensor system 10, providing the protocol frame output may be switched off.

It may be of interest to provide appropriate polynoms for the temperature compensation and/or the stress compensation in order to achieve a limitation of usable temperature and/or stress values for the sensor system 10.

The first temperature signal T_Main may further be used to perform an offset compensation for the first sensor element 100. Based on the first temperature signal a temperature compensation for the first sensor element 100 may be performed, which is considered when performing a sensitivity compensation for the first sensor element 100. As mentioned above the first sensor element 100 may be of different sensitivity compared to the second sensor element 200. The first signal after offset-compensation and sensitivity compensation may undergo a first calibration process HADC PRECAL, followed by some zero shifting and gain correction. Subsequently a low pass filtering may be applied to the gain corrected first signal followed by some clamping or clipping followed by some second calibration which is used or a CRC calculation for the clamped first signal.

As a further measure to increase functional safety and/or reliability for the sensor system 10 of the present disclosure once a maximum temperature value has been determined by the temperature comparison, as mentioned above, a warning may be issued and sensor signals may be discarded or marked as invalid.

If possible it may be of interest for the main signal path 101 to keep sending its measurement data, while the sub signal path 202 may forward an error message or warning using the digital protocol (PSI5 or SPC) which is thereby forwarded to an electronic control unit ECU.

The signal Stress_Main from the first stress sensor 120 may be used together with the signal Stress_Sub from the sub stress sensor 220 in order to do a stress comparison in order to detect whether the measured stress levels are exceeding a predefined allowable maximum for safe operation. Furthermore the signals Stress_Main and Stress_Sub may be used to assess any amount of stress gradient within the sensor system 10, which may be indicative of potential delamination processes or as a precursor thereof. Should such an overstress or over stress gradient occur, appropriate measures may be taken like issuing a stress warning or switching off the interface.

Similar the first temperature sensor 110 and the second temperature sensor 210 may be positioned separated on the sensor system, as was explained for the first stress sensor 120 and the second stress sensor 220, in order to allow for temperature gradients and/or stress gradients to be measured within the sensor system 10.

As for the first signal path 101, the digital representation of the second signal 244 enters the sub DSP 250 as an HADC Sub Raw data.

The sub temperature signal T_Sub may further be used to perform an offset compensation for the second sensor element 200. Based on the sub temperature signal a temperature compensation for the second sensor element 100 may be performed, which may also be considered when performing a sensitivity compensation for the sub sensor element 200.

The sub signal after offset-compensation and sensitivity compensation may undergo a first calibration process HADC PRECAL, followed by some zero shifting and gain correction. Subsequently a low pass filtering may be applied to the gain corrected first signal followed by some clamping or clipping, eventually followed by some second calibration, which in turn is used for a CRC calculation for the clamped second signal.

In combination with a frame counter a common CRC may be generated. For the situation displayed in FIG. 2 the merging of frames may be performed by the frame generator 310.

It is to be noted that for the sensor system 10 of the present disclosure one may choose to switch writing permission between the first DSP 150 and the sub DSP 250 additionally or alternatively to the frame merging described above. Such a switching will maintain separability of the (protocol) representation of the first signal path signal from the (protocol) representation of the second signal path signal. In other words, any errors occurring in one of the signal paths may remain visible for each of the signal paths, individually.

In such a setting main DSP 150 and sub DSP 250 may generate the digital protocol independently from one another and the (protocol) representation of the first sensor path signal and the respective second sensor path signal may be transmitted using a time multiplexing scheme. The time multiplexing may be conveniently achieved by writing corresponding digital output register. It may be of advantage to use two or more registers of the maximum length of the sensor output protocol, for example implemented within the (PSI5) protocol generator 310.

Further one may provide a master-slave scheme for the first DSP 150 and the second DSP 250. The master-slave scheme may be of interest in order to prevent collisions or congestions at the EEPROM bus, for example by using an EEP-CTRL signal. Yet as a further option one may perform compensation algorithms and generation of protocol frames and/or merged protocol frames at different points in time in order to improve a diverse succession of processing steps for the first DSP 150 and the sub DSP 250. As a positive side-effect one may further gain increased immunity against EMC events.

As a further measure one may consider implementing the first signal path 101 and the second signal path 202 as paths having different noise characteristics. The diverse design of the first signal path 101 and the second signal path 202 may be chosen to cause a known ratio of noise level or behavior for the first and second signal paths. If this noise level or behavior was to change over time, this may be an indication of a change of the sensor system in a relevant parameter or property.

In order to support such a scheme one may deliberately implement known noise sources along the first and/or second signal path. Further the protocol may stipulate a change of ADC range, which will have an impact of the noise characteristics of the respective signal path. A monitoring of a noise distribution of a signal path will give strong indication of when properties of the signal path change, and may even give an indication which component along the respective signal path caused the change in noise distribution.

Figure 4:
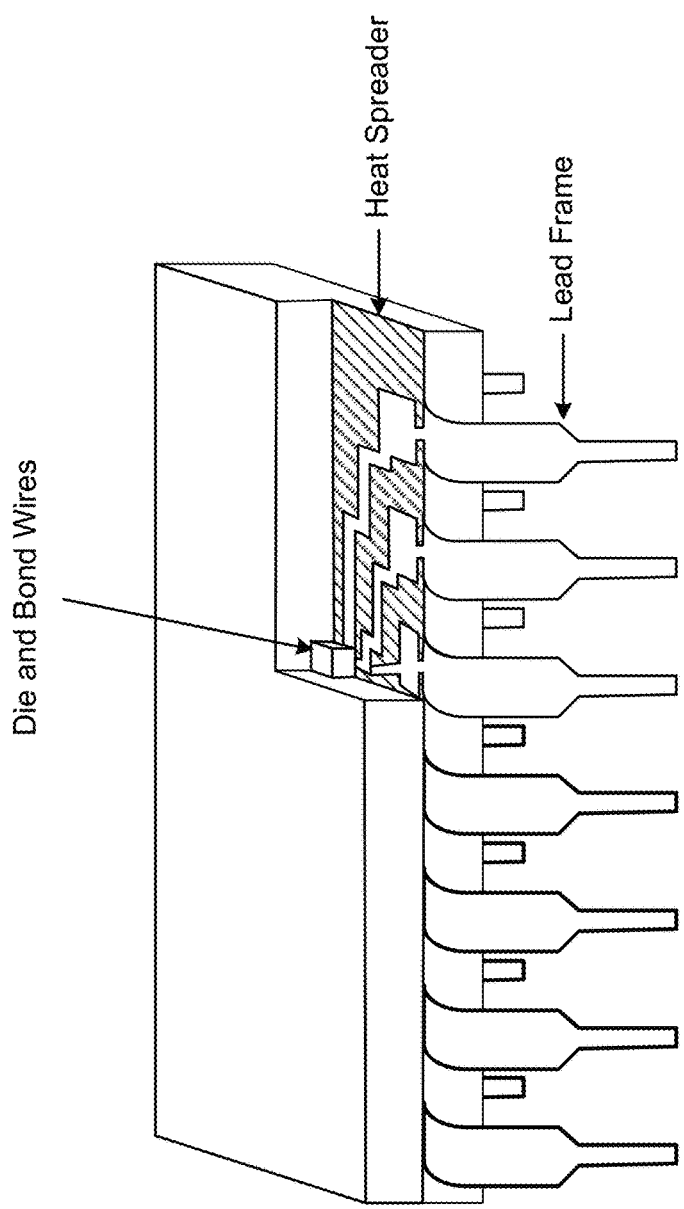
FIG. 4 shows a cutaway view of a dual-in-line package used for an integrated circuit.

FIG. 4 shows a typical integrated that may house the sensor system 10, namely comprising a silicon die containing monolithically integrated circuits and a package protecting the die from the environment and providing electrical connection of the die circuit to the outer system by bonds and pins as known by a person skilled in the art. The following paragraphs will give some aspects on how packaging and mechanical stress may impact on reliability of an integrated circuit in general and the sensor system 10 of the present disclosure in particular.

FIG. 4 is reproduced from "CMOS VLSI Design. A circuits and systems perspective" by Weste N. H. E and Harris D. M., Addison Wesley Longman, 2010.

Figure 5:
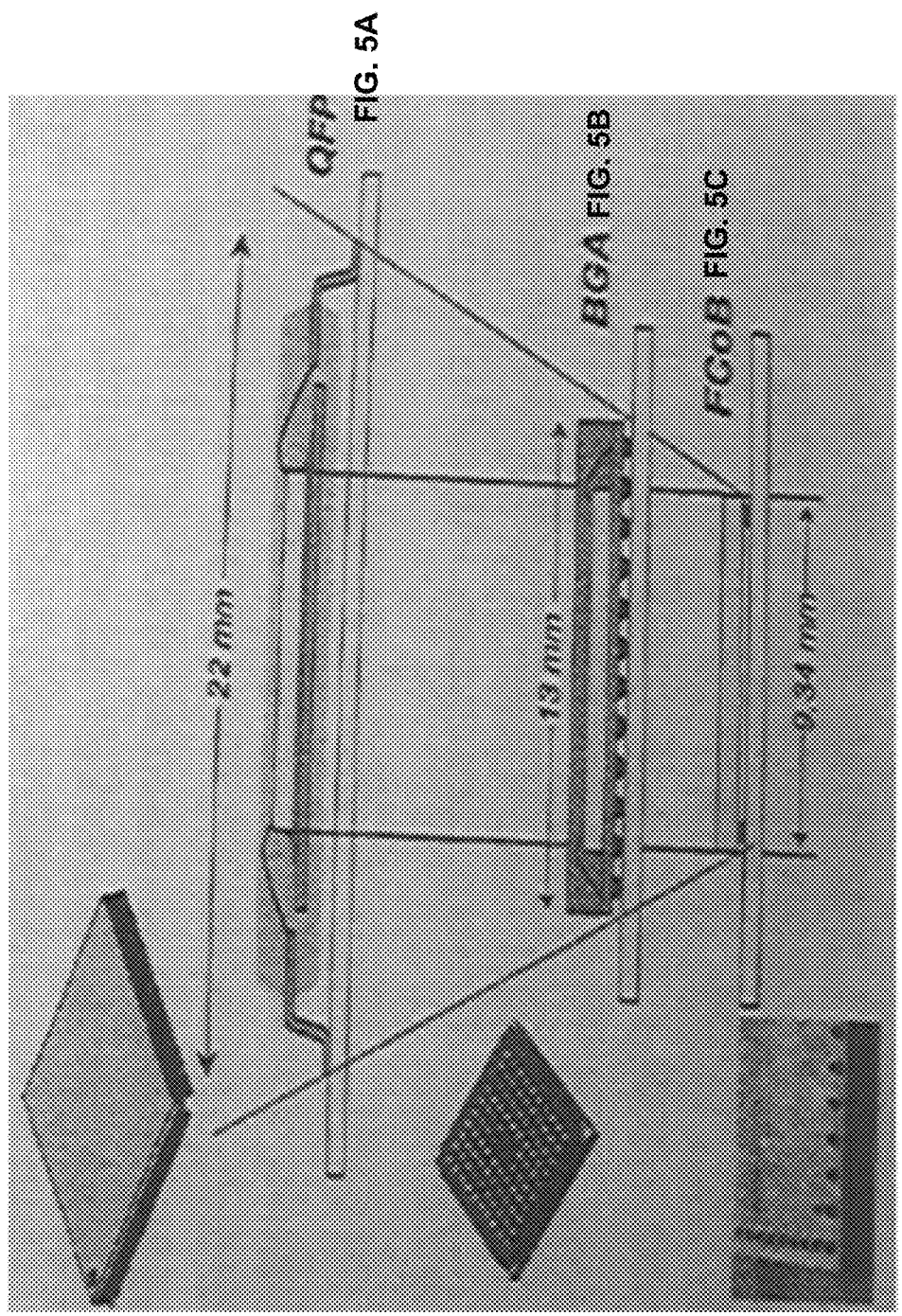
FIGS. 5A-5C show further examples of various integrated circuit packages used in the art.

FIGS. 5A-5C show various types of packages used for integrated circuits in the art. The present disclosure and sensor system 10 is however not limited to these types of packages.

FIG. 5A shows an integrated circuit package according to the Quad Flat Package (QFP). FIG. 5B shows a package according to the ball grid array with balls of solder points on the bottom.

FIG. 5C shows a Flip Chip on Board (FCoB) package. A person of ordinary skill in the art will readily appreciate that that a size of the package for an identical die or circuit on the die substantially depends on the type of package used in order to build the integrated circuit. The package may be chosen according to circumstances and applications.

Figure 6:
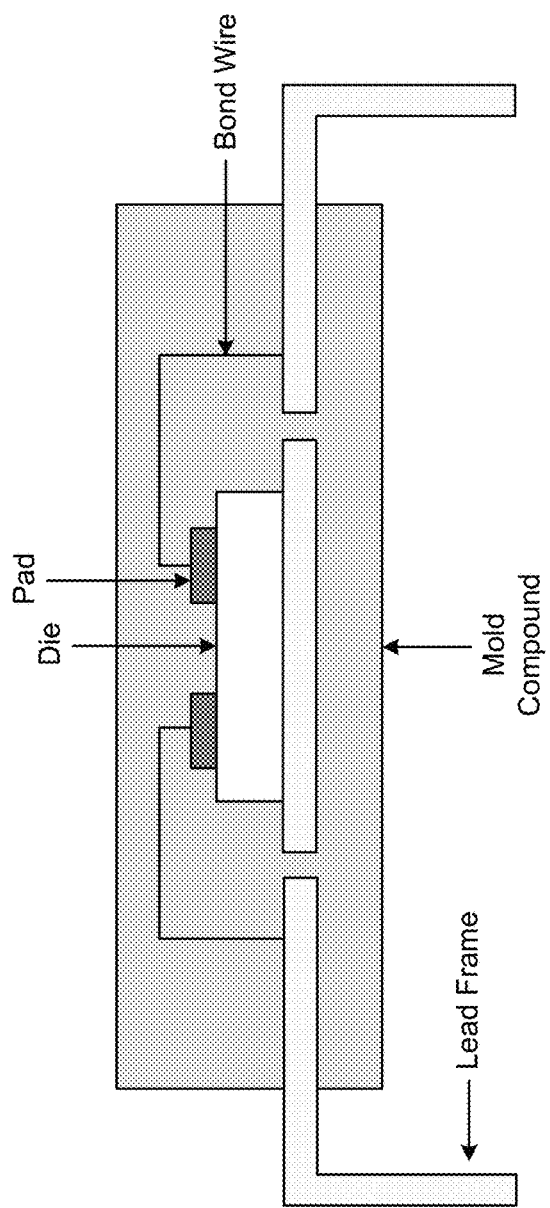
FIG. 6 shows a cross sectional view of a die inside a package.

FIG. 6 shows a die with a circuit inside a package. The package is typically formed from mold compound encapsulating the die and the circuit comprised thereon. The die may be glued to a lead frame configured for attaching the die. Bond wires may connect pads on a die surface with corresponding pins of the integrated circuit. The pins extending beyond the mold compound may be produced as a part of the lead frame. The outer package encapsulation is formed by a so called mold compound.

Figure 7:
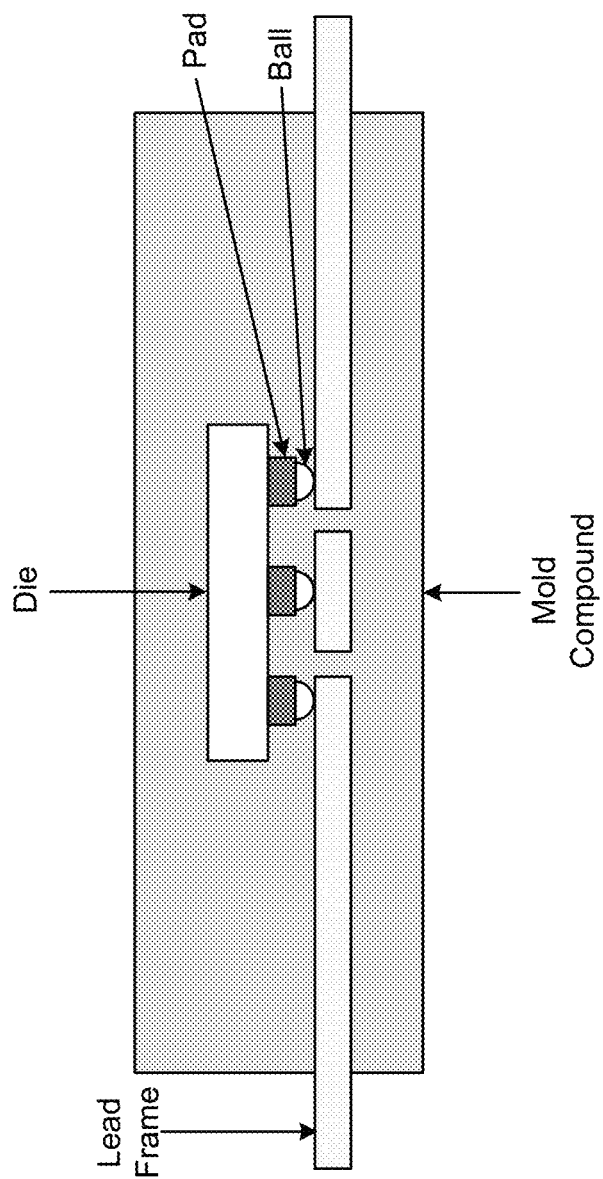
FIG. 7 shows a cross sectional view of a die in a flip chip technology inside a package.

FIG. 7 shows a cross sectional view of an integrated circuit with a die in Flip Chip technology. In FIG. 7 the die comprising the circuit is again disposed inside a package formed by mold compound encapsulating the die. In Flip chip technology the die exhibits balls made from solder, which are formed on one surface of the die. These balls are used to form the conducting connection to a lead frame.

A potentially dangerous kind of fault is a delamination of the package. The delamination is defined by formation of a gap between normally directly attached parts inside the package. Different types of delamination are indicated in FIG. 8.

Figure 8:
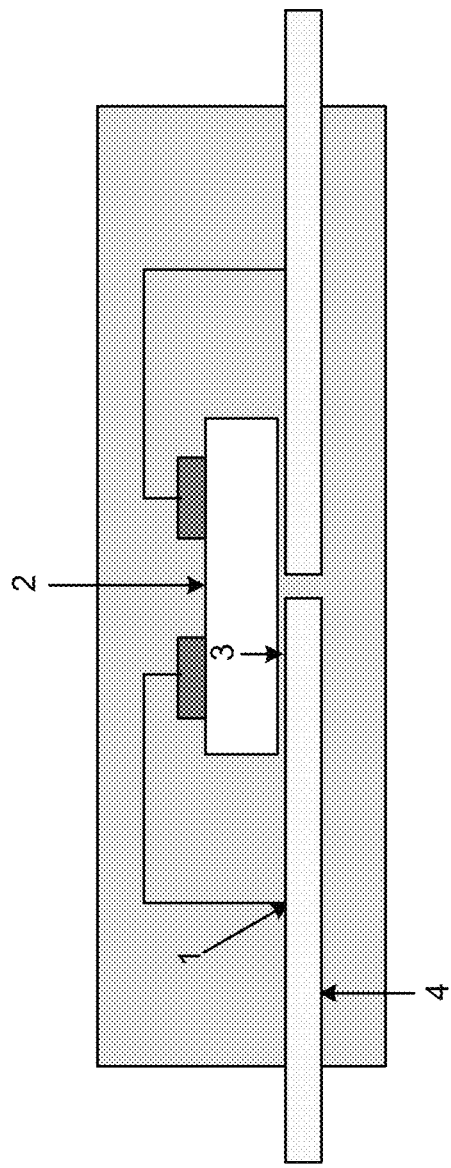
FIG. 8 shows potential forms of delamination for an integrated circuit.

FIG. 8 shows various types of delamination potentially causing a dangerous kind of fault. Reference numeral 1 indicates a gap formed between the mold compound and the lead frame on side of the bond. Reference numeral 2 refers to a gap formation between the mold compound and the die surface. Reference numeral 3 indicates a formation of a gap between the die's lower surface and the lead frame. Reference numeral 4 refers to a gap forming between the mold compound and the lead frame on the opposite of bond side.

It is one objective of the present disclosure to provide a detection mechanism for such delamination. As a first preferred implementation a resistive stress sensor element may be integrated into the die. The stress sensing element can detect a delamination effect by a sudden change in the mechanical stress conditions present within the die. Without limitation the resistive element may be implemented using the piezo resistive effect of silicon as schematically shown in FIG. 9.

Figure 9:
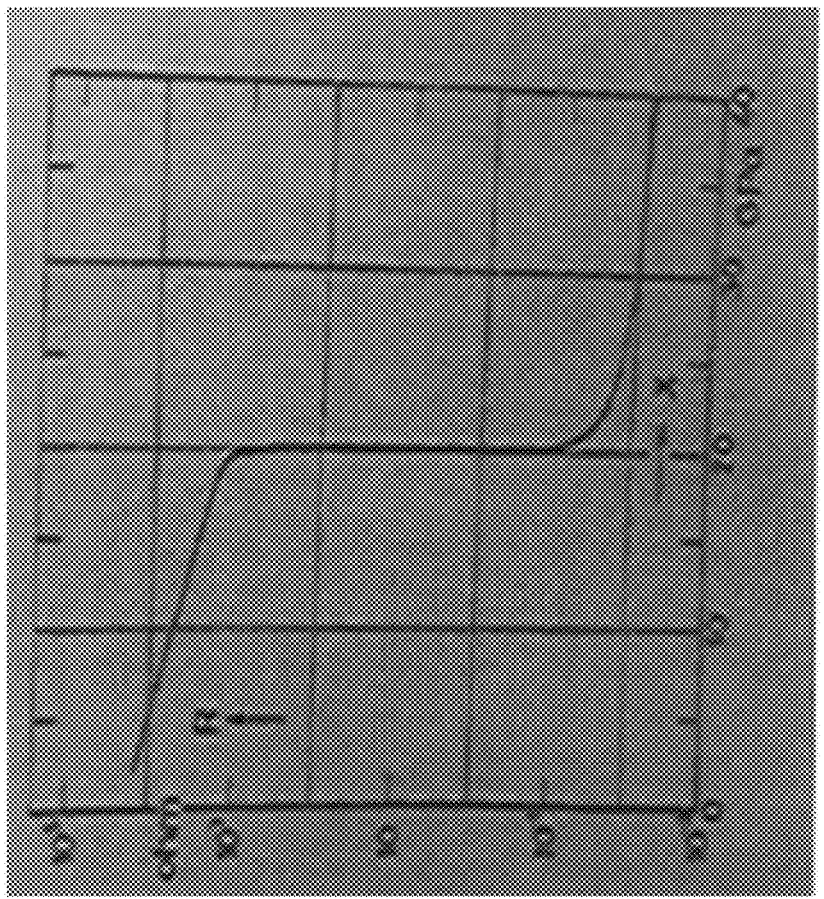
FIG. 9 shows a dependency of piezoresistance over pressure for an n-type silicon sample.

FIG. 9 shows Piezo resistance over pressure for an n-type silicon sample. For the present disclosure the part of the characteristics below the sudden increase is of interest. The sudden increase is caused by a phase transition in the crystal. This Figure is reproduced from K. Seeger, Semiconductor Physics, Springer Verlag.

It is also possible to make use of a change in carrier mobility of doped silicon dependent on mechanical stress. This stress dependency may be used to measure and/or monitor a change in mechanical stress within doped silicon material, as is used in integrated circuits. The dependence of carrier mobility may be used in strained silicon technology, as is known to a person of ordinary skill in the art.

It is also possible to form the resistive stress sensing element as part of the package fabrication process using piezoresistive or semiconducting layers.

In order to detect changes in mechanical stress potentially pertaining to delamination as described in FIG. 8, one may for example identify delamination via measurement of mechanical stress, wherein a delamination process becomes identifiable due to sudden changes or jumps in mechanical stress measured within the die and/or the package respectively.

Alternatively one may employ a piezo resistive measurement principle in order to detect changes in mechanical stress within the die and/or the package.

As a further option one may employ a strained silicon stress sensor, wherein a change in mobility of charge carriers in metal oxide semiconductors or Bipolar circuitries as known in the art.

As a yet further option one may deploy resistive stress-sensing element comprised within the package, i.e. the resistive stress sensing element being disposed in the package during manufacture of the integrated circuit and/or the integrated circuit package.

Further one may use techniques adapted to detect cracks or micro cracks within the die and/or the circuit.

Further one may alternatively or additionally employ two individual stress sensors in order to reliably assess whether or not there was a change in mechanical stress and whether or not the chip was damaged.

In rather hostile conditions it may be of interest to employ corrosion detection. This is of interest as corrosion may be a precursor of delamination processes under hostile conditions, such as wet, humid, exposed to acids, salt, and the like.

Figure 10:
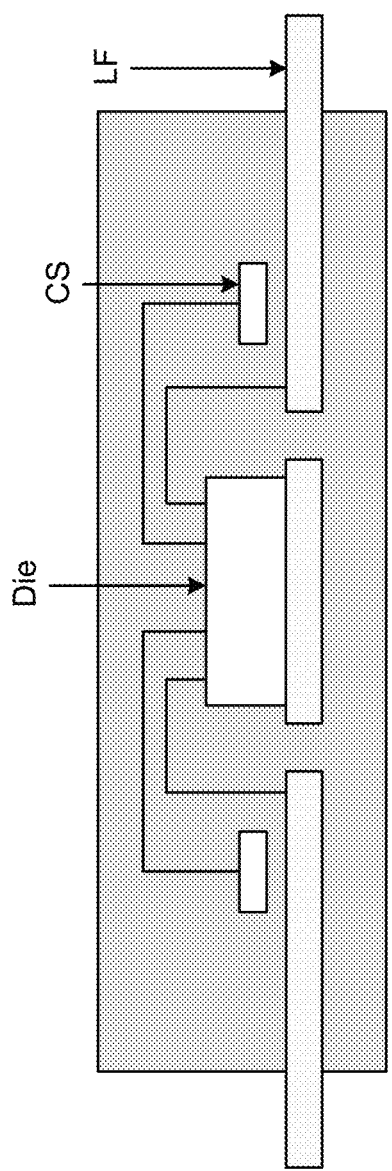
FIG. 10 shows an integrated circuit within a package together with a capacitive probe structure.

Yet another preferred method of detecting changes in mechanical stress is to employ a package comprising a capacitive probe structure CS, as is depicted in FIG. 10

FIG. 10 shows an integrated circuit (not shown) on a die, the die being coupled to the lead frame as before. Further to the previous examples, the die is also coupled to a capacitive probe structure. The capacitive probe structure CS is shown in FIG. 10 as an entity not directly coupled to the die, however depending on circumstances the capacitive probe structure may be very well formed integral to the die.

The package with capacitive probe structure CS is designed to supervise an area between the lead frame LF and the capacitive probe structure CS. It is of interest for the area to cover such regions of the integrated circuit prone to delamination as discussed with regards to FIG. 8, for example the region indicated by reference numeral 1 in FIG. 8.

The probe structure CS may conveniently bonded to the die forming an electrical connection between both. The probe structure is advantageously however not connected to the outside of the package.

A capacitance measurement circuit (for example using oscillators—not shown) may be formed on the die. The capacitance measurement circuit may be activated at certain points in time in order to assure the non-existence of gaps (delamination) by measuring the capacity between CS and the leadframe LF. The measured value may for the detection of delamination be compared to expected capacitance values. The activation of the measurement circuit at certain points in time only, may be of interest in order to reduce power consumption of the circuit and also to reduce electromagnetic disturbances stemming from switching within the measurement circuit, such as a switching of capacitance plates.

The capacitive measurement described may further be deployed for detection of corrosion effects where the lead frame becomes destroyed or non-conductive.

In another embodiment the capacitive measurement structure SE may be fully integrated on the die, for example using the highest metallization layer (as indicated by reference numeral 2 in FIG. 8).

The capacitive measurement is intended in order to detect a delamination between the die surface and the mold compound. The die surface may be covered (partially) by a comb like structure with two or more electrodes. Measuring the capacity between the electrodes may indicate delamination according to reference numeral 2 in FIG. 8 very reliably. A formation of a gap (either gas or liquid filled) will be visible in a capacity change, too.

The above described circuits and structures are designed to detect a potential dangerous fault. In case the fault is detected, the circuits may trigger either an error message via an interface of the component or will prevent the component from sending data as an indication of the fault.

What is claimed is:

1. A sensor system comprising:
a first sensor element coupled to a first signal path forwarding a first sensor signal,
a second sensor element coupled to a second signal path forwarding a second sensor signal representing a same physical quantity as the first sensor signal;
a first signal processing element configured to provide a first protocol representation of the first sensor signal at a first point in time; and
a second signal processing element configured to provide a second protocol representation of the second sensor signal at a second point in time,
wherein the second point in time is different from the first point in time, and
wherein the first signal path comprises at least one signal path element providing diversity between the first signal path and the second signal path with regards to common cause errors induced by an external parameter to a substrate.

2. The sensor system according to claim 1, wherein a first analog to digital converter (ADC) within the first signal path is implemented diverse to a second ADC within the second signal path.

3. The sensor system according to claim 1,
wherein the first signal processing element is within the first signal path; and
wherein the second signal processing element is within the second signal path,
the first protocol representation of the first sensor signal being independent from the second protocol representation of the second sensor signal.

4. The sensor system according to claim 1, wherein the sensor system comprises:
a first temperature sensor, and
a second temperature sensor,
the second temperature sensor being diverse to the first temperature sensor in its response to temperature changes.

5. The sensor system according to claim 1, wherein the sensor system comprises:
a first stress sensor, and
a second stress sensor,
the second stress sensor being diverse to the first stress sensor in its response to mechanical stress.

6. The sensor system according to claim 4, wherein the sensor system comprises:
a first stress sensor, and
a second stress sensor,
the second stress sensor being diverse to the first stress sensor in its response to mechanical stress.

7. The sensor system according to claim 6, wherein the first temperature sensor, the second temperature sensor, the first stress sensor, and the second stress sensor are coupled to the second signal path.

8. The sensor system according to claim 1, wherein the second signal processing element is further configured to provide a protocol representation of at least one of a first temperature signal, a second temperature signal, a first stress signal, or a second stress signal.

9. The sensor system according to claim 1,
wherein the first signal processing element is configured to provide a first error correction to the first protocol representation of the first sensor signal, and
wherein the second signal processing element is configured to provide a second error correction to the second protocol representation of the second sensor signal.

10. The sensor system according to claim 9, wherein the first error correction to the first protocol representation of the first sensor signal is independent from the second error correction to the second protocol representation of the second sensor signal.

11. The sensor system according to claim 1,
wherein a merging element is configured to merge the first protocol representation of the first sensor signal and the second protocol representation of the second sensor signal into a merged protocol representation, and
wherein independence of the first sensor signal and the second sensor signal is maintained within the merged protocol representation.

12. The sensor system according to claim 11, wherein the merging element is implemented as a time multiplexing of the first protocol representation of the first sensor signal and the second protocol representation of the second sensor signal.

13. The sensor system according to claim 4, wherein the first temperature sensor has a positive temperature dependence, while the second temperature sensor has a negative temperature dependence.

14. The sensor system according to claim 13, wherein a first temperature dependence for a given temperature range causes a protocol representation of a first temperature range to be distinct from a protocol representation of a second temperature dependence for the given temperature range.

15. The sensor system according to claim 5, wherein the first stress sensor has a first response characteristic, while the second stress sensor has a second response characteristic,
the second response characteristic crossing the first response characteristic over a given stress range at least once.

16. The sensor system according to claim 1, wherein the first sensor element and the second sensor element respond differently to the external parameter.

17. The sensor system according to claim 1,
wherein a first response associated with the first signal path is based on a positive coefficient for a particular type of measurement, and
wherein a second response associated with the second signal path is based on a negative coefficient for the particular type of measurement.

18. The sensor system according to claim 1, wherein the first sensor element is configured to measure an angle of an external rotating magnetic field.

19. The sensor system according to claim 1,
wherein the first sensor element comprises a first quantity of Hall plates,
wherein the second sensor element comprises a second quantity of Hall plates, and
wherein the second quantity of Hall plates is different from the first quantity of Hall plates.

20. The sensor system according to claim 1,
wherein a first digital representation, of a first signal associated with the first signal path, is within a first value range,
wherein a second digital representation, of a second signal associated with second first signal path, is within a second value range, and
wherein the second value range does not overlap with the first value range.

* * * * *